United States Patent
Oram et al.

(10) Patent No.: US 10,679,909 B2
(45) Date of Patent: Jun. 9, 2020

(54) SYSTEM, METHOD AND NON-TRANSITORY COMPUTER READABLE MEDIUM FOR TUNING SENSITIVIES OF, AND DETERMINING A PROCESS WINDOW FOR, A MODULATED WAFER

(71) Applicant: KLA-Tencor Corporation, Milpitas, CA (US)

(72) Inventors: David Craig Oram, Fremont, CA (US); Abhinav Mathur, San Jose, CA (US); Kenong Wu, Davis, CA (US); Eugene Shifrin, Sunnyvale, CA (US)

(73) Assignee: KLA-TENCOR CORPORATION, Milpitas, CA (US)

( * ) Notice: Subject to any disclaimer, the term of this patent is extended or adjusted under 35 U.S.C. 154(b) by 247 days.

(21) Appl. No.: 15/813,004

(22) Filed: Nov. 14, 2017

(65) Prior Publication Data

US 2018/0144996 A1    May 24, 2018

Related U.S. Application Data

(60) Provisional application No. 62/425,029, filed on Nov. 21, 2016.

(51) Int. Cl.
| | |
|---|---|
| *H01L 21/66* | (2006.01) |
| *G01N 21/88* | (2006.01) |
| *H01L 21/67* | (2006.01) |
| *G01N 21/95* | (2006.01) |

(52) U.S. Cl.
CPC ......... *H01L 22/12* (2013.01); *G01N 21/8806* (2013.01); *H01L 21/67288* (2013.01); *H01L 22/20* (2013.01); *G01N 21/9501* (2013.01); *G01N 2021/8825* (2013.01); *G01N 2021/8848* (2013.01); *G01N 2021/8883* (2013.01)

(58) Field of Classification Search
None
See application file for complete search history.

(56) References Cited

U.S. PATENT DOCUMENTS

| | | | | |
|---|---|---|---|---|
| 7,288,959 | B1 * | 10/2007 | Lee | H03K 19/0005 326/30 |
| 7,417,459 | B2 * | 8/2008 | Wilson | H03K 19/0175 326/82 |
| 7,440,607 | B1 | 10/2008 | Lin et al. | |
| 7,729,529 | B2 * | 6/2010 | Wu | G01N 21/95607 382/144 |
| 8,111,900 | B2 * | 2/2012 | Wu | G01N 21/95607 378/34 |
| 8,213,704 | B2 | 7/2012 | Peterson et al. | |
| 9,518,934 | B2 | 12/2016 | Chen et al. | |

(Continued)

OTHER PUBLICATIONS

International Search Report from PCT Application No. PCT/US2017/062622, dated Feb. 12, 2018.

*Primary Examiner* — Anand P Bhatnagar
(74) *Attorney, Agent, or Firm* — Zilka-Kotab, P.C.

(57) ABSTRACT

A system, method, and non-transitory computer readable medium are provided for tuning sensitivities of, and determining a process window for, a modulated wafer. The sensitivities for dies of the modulated wafer are tuned dynamically based on a single set of parameters. Further, the process window is determined for the modulated wafer from prior determined parameter-specific nominal process windows.

9 Claims, 11 Drawing Sheets

(56) References Cited

U.S. PATENT DOCUMENTS

| | | | | |
|---|---|---|---|---|
| 2006/0239051 | A1* | 10/2006 | Wilson | H03K 19/0175 363/147 |
| 2006/0291714 | A1* | 12/2006 | Wu | G01N 21/95607 382/149 |
| 2010/0226562 | A1* | 9/2010 | Wu | G01N 21/95607 382/149 |
| 2011/0194752 | A1* | 8/2011 | Pang | G03F 1/84 382/149 |
| 2012/0308112 | A1* | 12/2012 | Hu | G01N 21/9501 382/149 |
| 2014/0282334 | A1* | 9/2014 | Hu | G06F 30/398 716/112 |
| 2014/0376802 | A1* | 12/2014 | Wu | G06T 7/001 382/149 |
| 2015/0324965 | A1* | 11/2015 | Kulkarni | G01N 21/8806 382/144 |

* cited by examiner

| | | | | | | |
|---|---|---|---|---|---|---|
| | | 99971<br>F0.100<br>E-2.000 | | 99966<br>F0.100<br>E2.000 | | |
| | 99982<br>F0.100<br>E-4.000 | 54765<br>F0.080<br>E-2.000 | | 55159<br>F0.080<br>E2.000 | 99812<br>F0.100<br>E5.000 | |
| | 61335<br>F0.080<br>E-4.000 | 3445<br>F0.060<br>E-2.000 | | 2946<br>F0.060<br>E2.000 | 53694<br>F0.080<br>E5.000 | |
| | 2856<br>F0.060<br>E-4.000 | 120<br>F0.040<br>E-2.000 | | 179<br>F0.040<br>E2.000 | 339<br>F0.060<br>E5.000 | |
| 73971<br>F-0.080<br>E-4.000 | 788<br>F0.040<br>E-4.000 | 100<br>F0.020<br>E-2.000 | | 117<br>F0.020<br>E2.000 | 899<br>F0.040<br>E5.000 | 3440<br>F-0.080<br>E5.000 |
| 99386<br>F-0.100<br>E-4.000 | 49<br>F0.020<br>E-4.000 | 73<br>F-0.020<br>E-2.000 | | 110<br>F-0.020<br>E2.000 | 1489<br>F0.020<br>E5.000 | 99811<br>F-0.100<br>E5.000 |
| | 144<br>F-0.020<br>E-4.000 | 64<br>F-0.040<br>E-2.000 | | 104<br>F-0.040<br>E2.000 | 324<br>F-0.020<br>E5.000 | |
| | 80<br>F-0.040<br>E-4.000 | 165<br>F-0.060<br>E-2.000 | | 116<br>F-0.060<br>E2.000 | 113<br>F-0.040<br>E5.000 | |
| | 328<br>F-0.060<br>E-4.000 | 80278<br>F-0.080<br>E-2.000 | | 12687<br>F-0.080<br>E2.000 | 250<br>F-0.060<br>E5.000 | |
| | | 98394<br>F-0.100<br>E-2.000 | | 93789<br>F-0.100<br>E2.000 | | |

FIGURE 4A

SYSTEM, METHOD AND NON-TRANSITORY COMPUTER READABLE MEDIUM FOR TUNING SENSITIVIES OF, AND DETERMINING A PROCESS WINDOW FOR, A MODULATED WAFER

RELATED APPLICATION(S)

This application claims the benefit of U.S. Provisional Patent Application No. 62/425,029 filed Nov. 21, 2016, the entire contents of which are incorporated herein by reference.

FIELD OF THE INVENTION

The present invention relates to inspection of modulated wafers, and more particularly to sensitivity tuning and process window characterization for modulated wafers.

BACKGROUND

Currently, defects in wafers can be detected by comparing a target die on the wafer to reference dies on the wafer. Inspection systems accomplish this by taking images of the target and reference dies for comparison purposes. In particular, detecting the defects often involves performing two separate comparisons to generate two separate results, one comparison being between the target die and one of the reference dies and another comparison being between the target die and the other one of the reference dies. Any similarity between the two separate comparison results is generally used as an indicator of a defect in the die. Detected defects are then used as the basis for qualifying the design of the wafer (e.g. determining areas of the design that are systematically prone to defects), and further for characterizing the process window used by a manufacturing tool to fabricate the wafer (e.g. the parameters in which the manufacturing tool fabricates the wafer within the specifications of the design).

Prior art FIG. 1 shows traditional layout for a wafer having a plurality of target dies in a column 102, each being a same pattern modulated (i.e. amplified) by a different combination of parameter (e.g. focus (F) and exposure (E)) values, and further having a plurality of reference dies in columns 104, 106 situated on either side of the column of target dies and each being a nominal (i.e. not modulated) version of the same pattern. Thus, for any particular one of the target dies in column 102, a reference die from column 104 and a reference die from column 106 may be used for detecting defects in the particular target die (see box 108). While the reference dies are shown as being adjacent to the target die, this is not necessarily always the case. For example, in other wafer configurations the reference dies for any particular target die may be those closest, but not necessarily adjacent, to the particular target die.

Unfortunately, traditional methods related to the above described defect detection involve techniques that are inefficient and thus time and resource intensive. Just by way of example, current methods for process window characterization (e.g. process window qualification (PWQ) methods) require numerous scan iterations, including a separate test for each die which further involves a separate scan for each modulation of the die.

To compound the limitations mentioned above, current methods further involve estimating the inspection sensitivities separately for each modulation. This may be accomplished using an Initial Threshold Finder (ITF), but in any case requires a preliminary scan of every modulated die to assess defectivity of the modulated die and assign sensitivity to the modulated die, so that the following inspection scan of the modulated dies is performed based on the assigned sensitivities There is thus a need for addressing these and/or other issues associated with the prior art.

SUMMARY

In one embodiment, a system, method, and non-transitory computer readable medium are provided for determining a process window for a modulated wafer. In use, a first care area region is defined for a wafer having a plurality of dies modulated differently according to at least two parameters. Additionally, a first defect scan of the wafer is performed, based on the first care area region, and results of the first defect scan are obtained. Further, from the results of the first defect scan and based on an attribute space, a first nominal process window is determined for a first parameter of the at least two parameters. Still yet, from the results of the first defect scan and based on the attribute space, a second nominal process window is determined for a second parameter of the at least two parameters. Additionally, a predicted process window is determined for the wafer, based on the first nominal process window and the second nominal process window. Additionally, a second defect scan of the wafer is performed within the predicted process window, based on a final care area, and results of the second defect can are obtained. Moreover, from the results of the second defect scan, a final process window is determined for the wafer.

In another embodiment, a system, method, and non-transitory computer readable medium are provided for tuning sensitivities of a modulated wafer. In use, the following are identified from a wafer having a plurality of dies modulated differently according to at least two parameters: a first die having a low modulation with respect to modulations of the plurality of dies, a second die having a medium modulation with respect to the modulations of the plurality of dies, and a third die having a high modulation with respect to the modulations of the plurality of dies. Additionally, based on a Taylor series expansion function, a first order offset is estimated from the first die and separate second order offsets are estimated from each of the second die and the third die. Further, an inspection of the wafer is performed that, for each die of the wafer subject to the inspection: (a) dynamically calculates an offset corresponding to a noise level in the die using the first order offset estimated from the first die and the second order offset estimated from the second die, and (b) applies the dynamically calculated offset as a sensitivity to the die.

BRIEF DESCRIPTION OF THE DRAWINGS

FIGS. 4A-4E illustrate an implementation of the first pass of the method of FIG. 3, in accordance with another embodiment.

DETAILED DESCRIPTION

The following description discloses methods for tuning sensitivities of, and determining a process window for, a modulated wafer, as well as a system and non-transitory computer readable medium for performing the same. It should be noted that the various embodiments described below may be implemented in the context of any inspection system (e.g. wafer inspection, reticle inspection, laser scanning inspection systems, etc.), such as the one described below with reference to FIG. 2B.

Figure 2A:
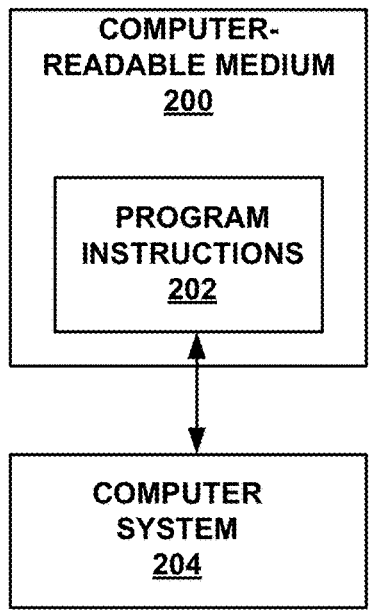
FIG. 2A shows a block diagram illustrating one embodiment of a non-transitory computer-readable medium that includes program instructions executable on a computer system for performing one or more of the computer-implemented methods described herein.

One embodiment relates to a non-transitory computer-readable medium storing program instructions executable on a computer system for performing the method mentioned above. One such embodiment is shown in FIG. 2A. In particular, as shown in FIG. 2A, computer-readable medium 200 includes program instructions 202 executable on computer system 204. The computer-implemented method includes the steps of the method described below with reference to FIG. 5. The computer-implemented method for which the program instructions are executable may include any other operations described herein.

Program instructions 202 implementing methods such as those described herein may be stored on computer-readable medium 200. The computer-readable medium may be a storage medium such as a magnetic or optical disk, or a magnetic tape or any other suitable non-transitory computer-readable medium known in the art. As an option, computer-readable medium 200 may be located within computer system 204.

The program instructions may be implemented in any of various ways, including procedure-based techniques, component-based techniques, and/or object-oriented. techniques, among others. For example, the program instructions may be implemented using ActiveX controls, C++ objects, JavaBeans, Microsoft Foundation Classes ("MFC"), or other technologies or methodologies, as desired.

The computer system 204 may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer system 204 may also include any suitable processor known in the art such as a parallel processor. In addition, the computer system 204 may include a computer platform with high speed processing and software, either as a standalone or a networked tool.

Figure 2B:
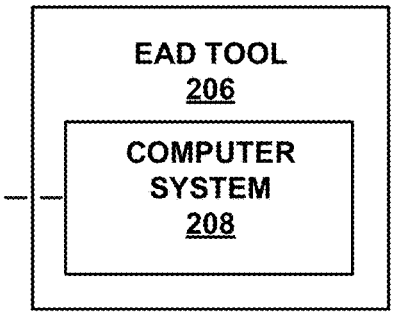
FIG. 2B is a schematic diagram illustrating a side view of one embodiment of an inspection system configured to detect defects on a fabricated device.
Figure 2B:
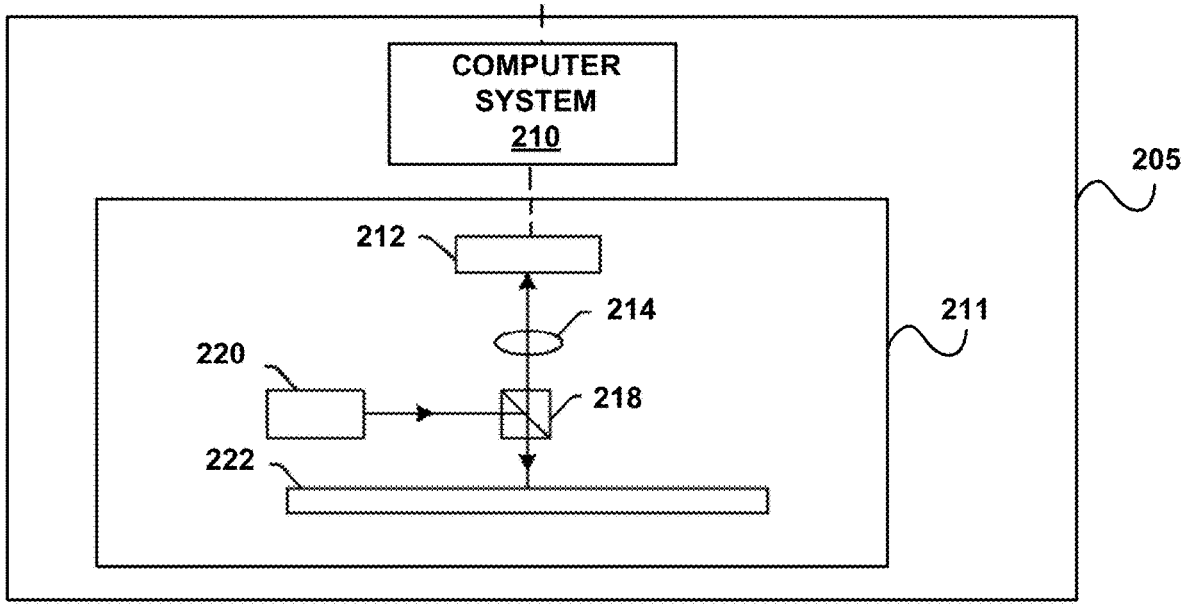

An additional embodiment relates to a system configured to perform the method mentioned above. One embodiment of such a system is shown in FIG. 2B. The system includes inspection system 205 configured to generate output for a component fabricated on a wafer (or other device). The system also includes one or more computer systems configured for performing the operations described below with reference to FIGS. 3 and 5. The one or more computer systems may be configured to perform these operations according to any of the embodiments described herein. The computer system(s) and the system may be configured to perform any other operations described herein and may be further configured as described herein.

In the embodiment shown in FIG. 2B, one of the computer systems is part of an electronic automation design (EAD) tool, and the inspection system and another of the computer systems are not part of the EAD tool. These computer system may include, for example, the computer system 204 described above with reference to FIG. 2A. For example, as shown in FIG. 2B, one of the computer systems may be computer system 208 included in EAD tool 206. The EAD tool 206 and the computer system 208 included in such a tool may include any commercially available EAD tool.

The inspection system 205 may be configured to generate the output for the component being fabricated on a wafer by scanning the wafer with light and detecting light from the wafer during the scanning. For example, as shown in FIG. 2B, the inspection system 205 includes light source 220, which may include any suitable light source known in the art. Light from the light source may be directed to beam splitter 218, which may be configured to direct the light from the light source to wafer 222. The light source 220 may be coupled to any other suitable elements (not shown) such as one or more condensing lenses, collimating lenses, relay lenses, objective lenses, apertures, spectral filters, polarizing components and the like. As shown in FIG. 2B, the light may be directed to the wafer 222 at a normal angle of incidence. However, the light may be directed to the wafer 222 at any suitable angle of incidence including near normal and oblique incidence. In addition, the light or multiple light beams may be directed to the wafer 222 at more than one angle of incidence sequentially or simultaneously. The inspection system 205 may be configured to scan the light over the wafer 222 in any suitable manner.

Light from wafer 222 may be collected and detected by one or more channels of the inspection system 205 during scanning. For example, light reflected from wafer 222 at angles relatively close to normal (i.e., specularly reflected light when the incidence is normal) may pass through beam splitter 218 to lens 214. Lens 214 may include a refractive optical element as shown in FIG. 2B. In addition, lens 214 may include one or more refractive optical elements and/or one or more reflective optical elements. Light collected by lens 214 may be focused to detector 212. Detector 212 may include any suitable detector known in the art such as a charge coupled device (CCD) or another type of imaging detector. Detector 212 is configured to generate output that is responsive to the reflected light collected by lens 214. Therefore, lens 214 and detector 212 form one channel of the inspection system 205. This channel of the inspection system 205 may include any other suitable optical components (not shown) known in the art.

Since the inspection system shown in FIG. 2B is configured to detect light specularly reflected from the wafer 222, the inspection system 205 is configured as a bright field (BF) inspection system. Such an inspection system 205 may, however, also be configured for other types of wafer inspection. For example, the inspection system shown in FIG. 2B may also include one or more other channels (not shown). The other channel(s) may include any of the optical components described herein such as a lens and a detector, configured as a scattered light channel. The lens and the detector may be further configured as described herein. In this manner, the inspection system 205 may also be configured for dark field (DF) inspection.

The inspection system 205 may also include a computer system 210 that is configured to perform one or more steps of the methods described herein. For example, the optical elements described above may form optical subsystem 211 of inspection subsystem 205, which may also include computer system 210 that is coupled to the optical subsystem 211. In this manner, output generated by the detector(s) during scanning may be provided to computer system 210. For example, the computer system 210 may be coupled to detector 212 (e.g., by one or more transmission media shown by the dashed line in FIG. 2B, which may include any suitable transmission media known in the art) such that the computer system 210 may receive the output generated by the detector.

The computer system 210 of the inspection system 205 may be configured to perform any operations described herein. In addition, computer system 210 may be configured to perform any other steps described herein. Furthermore, although some of the operations described herein may be performed by different computer systems, all of the operations of the method may be performed by a single computer system such as that of the inspection system 205 or a stand alone computer system. In addition, the one or more of the computer system(s) may be configured as a virtual inspector such as that described in U.S. Pat. No. 8,126,255 issued on Feb. 28, 2012 to Bhaskar et al., which is incorporated by reference as if fully set forth herein.

The computer system 210 of the inspection system 205 may also be coupled to another computer system that is not part of the inspection system such as computer system 208, which may be included in another tool such as the EAD tool 206 described above such that computer system 210 can receive output generated by computer system 208, which may include a design generated by that computer system 208. For example, the two computer systems may be effectively coupled by a shared computer-readable storage medium such as a fab database or may be coupled by a transmission medium such as that described above such that information may be transmitted between the two computer systems.

It is noted that FIG. 2B is provided herein to generally illustrate a configuration of an inspection system that may be included in the system embodiments described herein. Obviously, the inspection system configuration described herein may be altered to optimize the performance of the inspection system as is normally performed when designing a commercial inspection system. In addition, the systems described herein may be implemented using an existing inspection system (e.g., by adding functionality described herein to an existing inspection system) such as the 29xx/28xx series of tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

Figure 1:
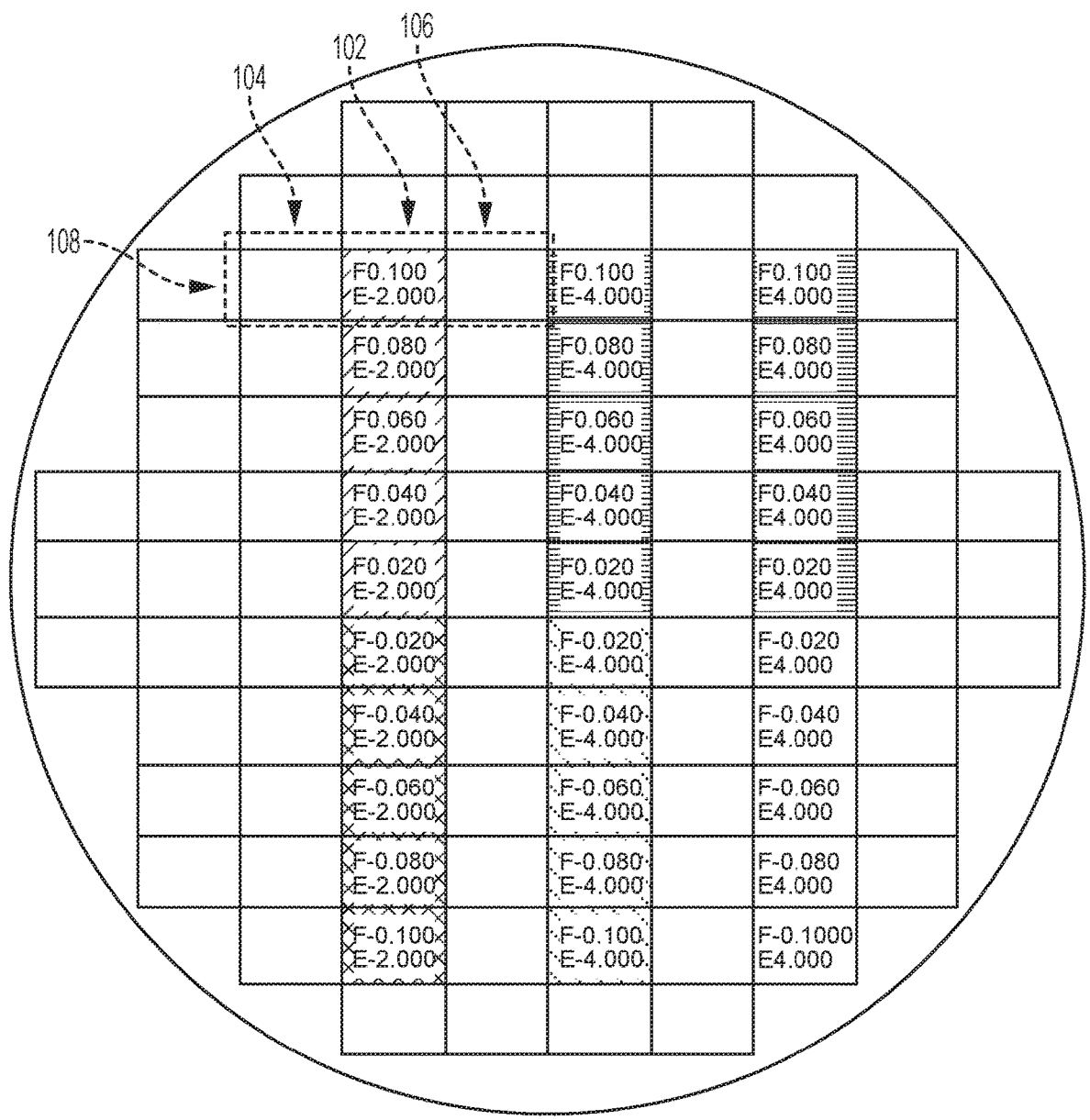
FIG. 1 shows an example layout for a wafer, in accordance with the prior art.
Figure 3:
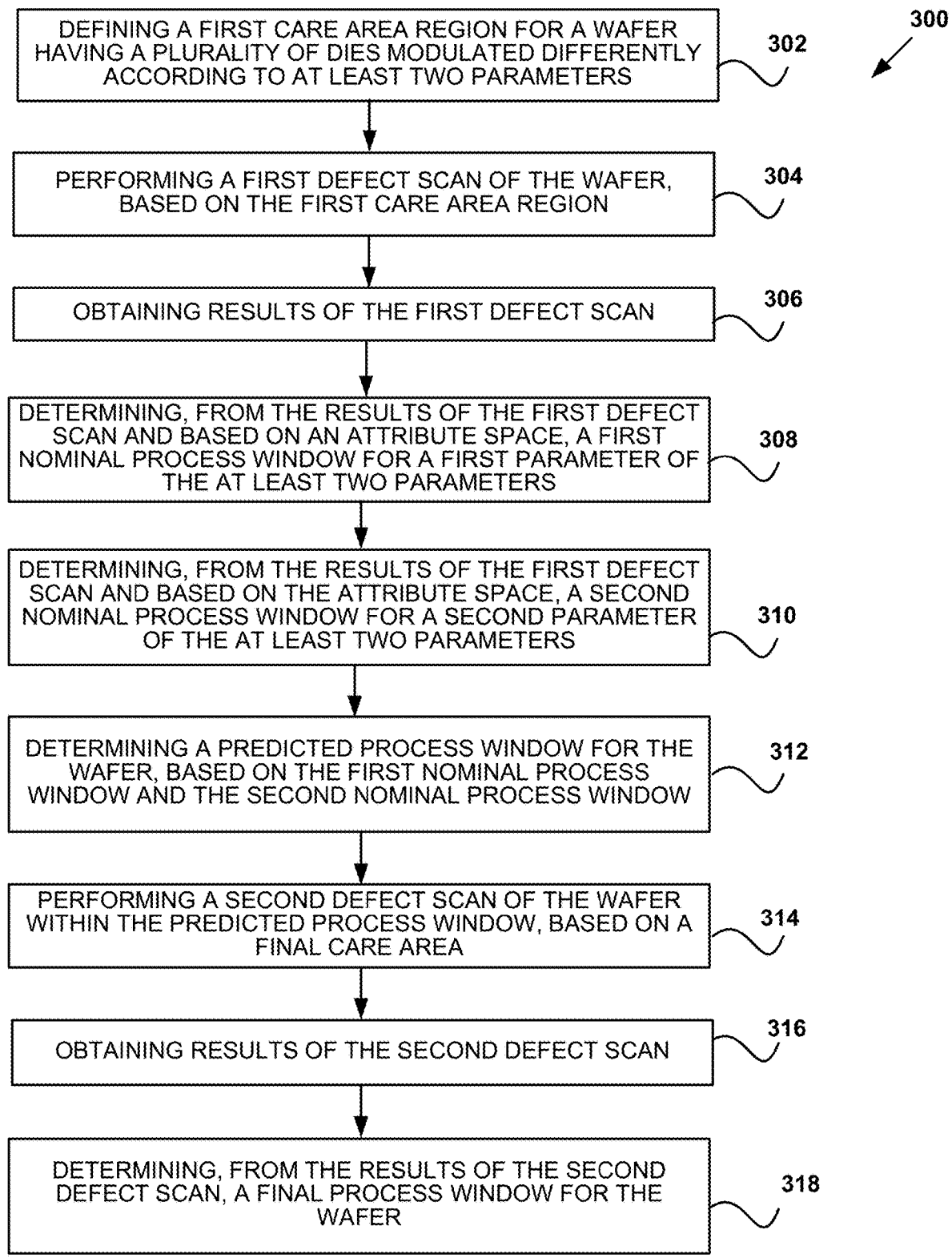
FIG. 3 illustrates a method for determining a process window for a modulated wafer, in accordance with one embodiment.

FIG. 3 illustrates a method 300 for determining a process window for a modulated wafer, in accordance with one embodiment. As shown in operation 302, a first care area region is defined for a wafer having a plurality of dies modulated differently according to at least two parameters. The wafer may be configured as described above with reference to Prior Art FIG. 1, including a plurality of dies (target dies) modulated differently according to at least two parameters. These parameters may be exposure, focus, etc., and the modulation can be any amplification (positive or negative) of one or more of the parameters. U.S. Pat. No. 8,213,704, which is incorporated herein by reference, discloses techniques for modulating a die of a wafer.

The first care area region may be defined for the wafer as a unique pattern where defect detection is to be performed, and thus may be identified from an image of the wafer as a set of connected image pixels representative of the unique pattern. The first care area region may of any shape and size, but as mentioned below is a subpart of a final care area in which defect detection is ultimately to be performed. In one exemplary embodiment, the first care area region may be specified as "dense thin lines." The first care area may be preconfigured for the method 300 (e.g. by a user, etc.), for example based on a determination that this care area will potentially exhibit defectivity occurring through process windows.

Additionally, as shown in operation 304, a first defect scan of the wafer is performed, based on the first care area region. In particular, the first defect scan of the wafer is performed within the first care area region. In one embodiment, the first defect scan may be performed using a one step tuning scan (OSTS) inspection of the wafer. U.S. Pat. No. 9,518,934, issued Dec. 13, 2016 to Chen et al., the entire contents of which are incorporated herein by reference, discloses one implementation of OSTS. As another option, OSTS that uses a standard MDAT algorithm and known defect down sampling techniques may be employed. MDAT is a defect detection method used by wafer inspection tools commercially available from KLA-Tencor, Milpitas, Calif. U.S. Pat. No. 7,440,607, issued Oct. 21, 2017 to Lin et al., the entire contents of which are incorporated herein by reference, discloses one implementation of MDAT. As yet another option, the method 500 described below with respect to FIG. 5 may optionally be implemented for the first defect scan.

In operation 306, results of the first defect scan are obtained. The results may indicate defects within the first care area region. Further, as shown in operation 308, from the results of the first defect scan and based on an attribute space, a first nominal process window is determined for a first parameter of the at least two parameters. Just by way of example, the first parameter for which the first nominal process window is determined may be the focus parameter. Further, the attribute space refers to any predetermined one or more attributes by which defects can be characterized, such as location, size, polarity, etc.

In one embodiment, the attribute space may include defect polarity. In this embodiment, the first nominal process window may be determined by tracking defect polarity, such as for bright defects (i.e. defects that are brighter than their background such as due to over-focusing which causes gaps in lines on the die) and dark defects (i.e. defects that are darker than their background such as due to under-focusing which causes bridges between otherwise separated lines on the die). For example, a number of bright defects detected for each different value of the first parameter (e.g. focus) may be tracked, as well as a number of dark defects detected for each different value of the first parameter. The value of the first parameter at which the number of bright defects is the lowest (hereinafter Parameter1Value1) and the value of the first parameter at which the number of dark defects is the lowest (hereinafter Parameter1Value2) may define the first nominal process window. In other words, the first nominal process window may include modulations between Parameter1Value1 and Parameter1Value2. In another embodiment, the first nominal process window may be determined using a polynomial fit of the defects. In any case, the first nominal process window excludes the modulated dies having a value for the first parameter (e.g. focus) that it outside of the first nominal process window.

Further, as shown in operation 310, from the results of the first defect scan and based on the attribute space, a second nominal process window is determined for a second parameter of the at least two parameters. Just by way of example, the second parameter for which the second nominal process window is determined may be the exposure parameter. In any case, the second nominal process window is determined based on the same attribute space as used to determine the first nominal process window.

Again, in one embodiment, the attribute space may include defect polarity. In this embodiment, the second nominal process window may be determined by tracking defect polarity, such as for bright defects (i.e. defects that are brighter than their background such as due to over-exposure which causes gaps in lines on the die) and dark defects (i.e. defects that are darker than their background such as due to overexposure which causes bridges between otherwise separated lines on the die). For example, a number of bright defects detected for each different value of the second parameter (e.g. exposure) may be tracked, as well as a number of dark defects detected for each different value of the second parameter. The value of the second parameter at which the number of bright defects is the lowest (hereinafter Parameter2Value1) and the value of the second parameter at which the number of dark defects is the lowest (hereinafter Parameter2Value2) may define the second nominal process window. In other words, the second nominal process window may include modulations between Parameter2Value1 and Parameter2Value2. In another embodiment, the second nominal process window may be determined using the polynomial fit of the defects. In any case, the second nominal process window excludes the modulated dies having a value for the second parameter (e.g. exposure) that it outside of the second nominal process window.

Additionally, as shown in operation 312, a predicted process window is determined for the wafer, based on the first nominal process window and the second nominal process window. The predicted process window may combine the first nominal process window and the second nominal process window, for example. In one embodiment, the predicted process window may be determined by down sampling the wafer using the first nominal process window and the second nominal process window, such that the predicted process window includes dies having modulated parameters within both the first nominal process window and the second nominal process window.

Still yet, as shown in operation 314, a second defect scan of the wafer is performed within the predicted process window, based on a final care area. In particular, the second defect scan of the wafer is performed within the final care area. As noted above, the final care area may include the above described first care area region as a subpart thereof. In one embodiment, the second defect scan may be performed using a one step tuning scan (OSTS) inspection of the wafer. As another option, OSTS that uses a standard MDAT algorithm and known defect down sampling techniques may be employed. As yet another option, the method 500 described below with respect to FIG. 5 may optionally be implemented for the second defect scan.

As shown in operation 316, results of the second defect can are obtained. The results may indicate defects within the final care area. Moreover, as shown in operation 318, from the results of the second defect scan, a final process window is determined for the wafer. This may be accomplished using methods known in the art. Optionally, as a further step following operation 318 (not shown), the final process window may be further refined using a predetermined PWEC sampling algorithm.

The present method 300 can therefore predict the process window based on a care area region that is smaller than a final desired care area, and then determine an actual process window for final care area of wafer using the predicted process window. Thus, the method 300 illustrates in one embodiment a two pass approach to process window characterization for a modulated wafer, with (1) the first pass (operations 302-312) using a smaller care area region than the second pass (operations 314-318), and (2) the second pass being performed within the smaller (predicted) process window. Both (1) and (2) will therefore reduce the number of iterations otherwise required by prior art techniques which scan each modulated die of the wafer in terms of the final care area, and therefore reduce the time to results (determination of the final process window for the wafer).

Figure 4B:
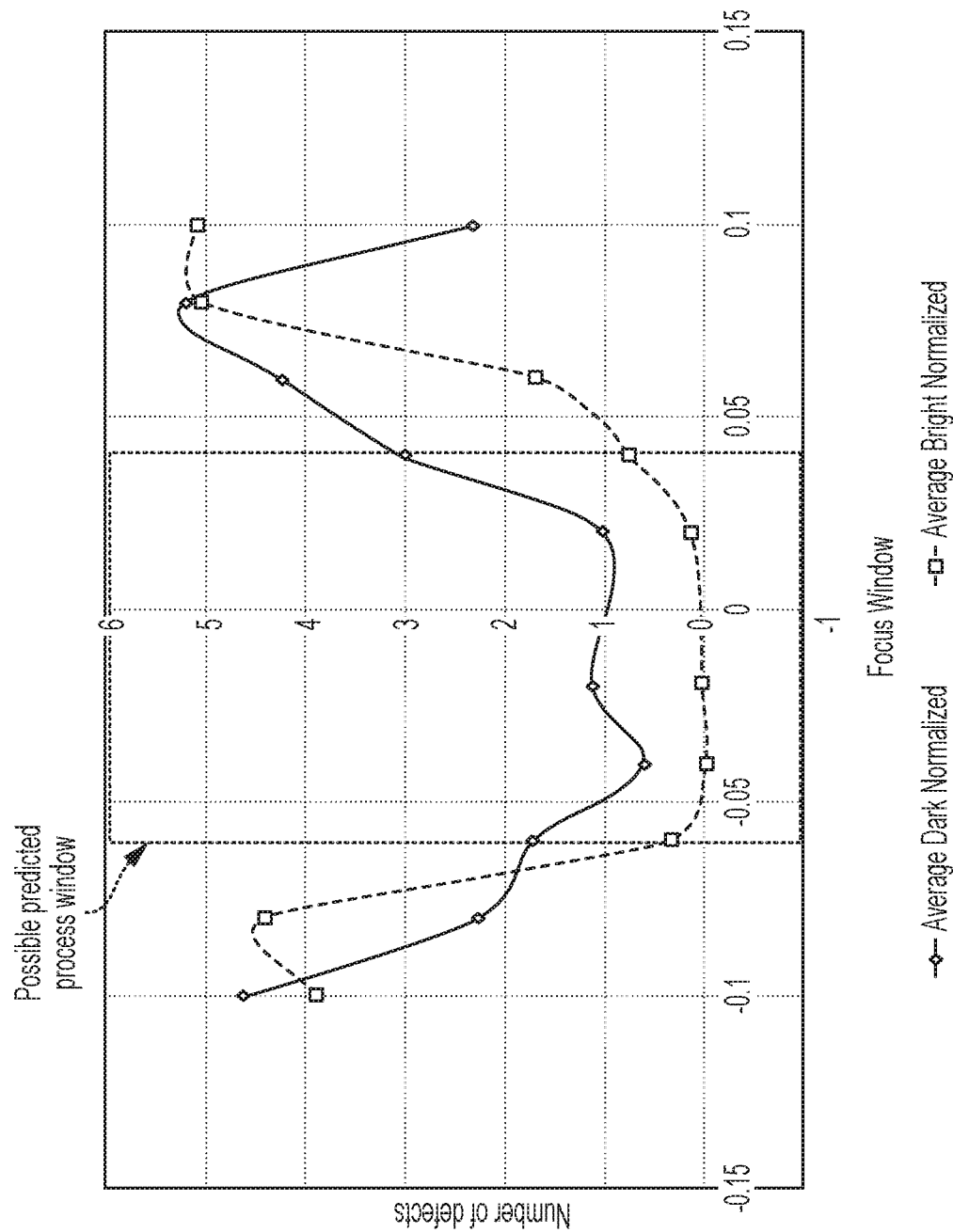
Figure 4C:
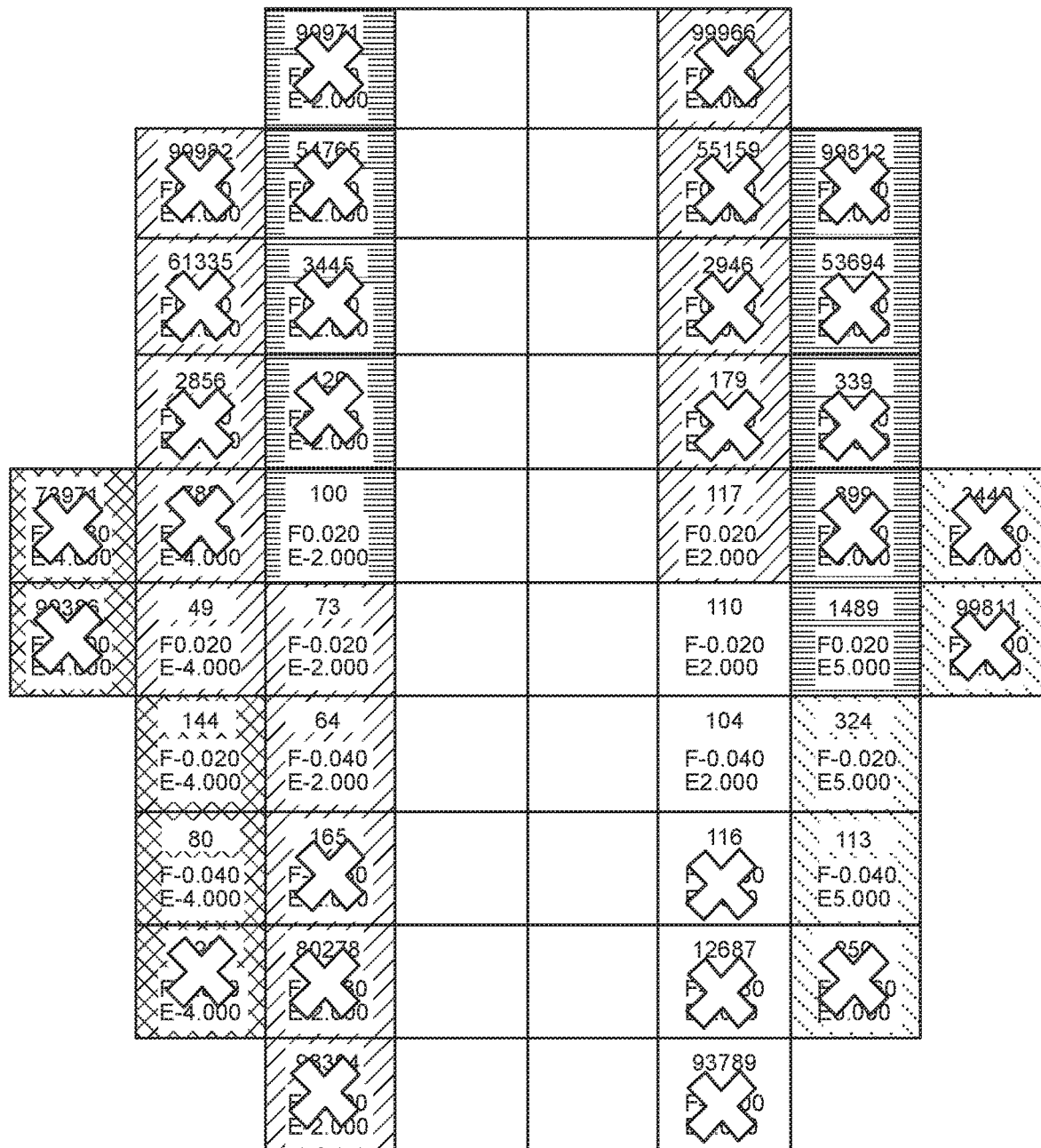

FIGS. 4A-4E illustrate an implementation of the first pass of the method of FIG. 3, in accordance with another embodiment. FIG. 4A shows an example of a modulated wafer. Specifically, FIG. 4A shows a wafer with dies modulated differently using different combinations of values for a focus parameter (F) and an exposure parameter (E). The first pass described in the method 300 of FIG. 3 is performed on the modulated wafer of FIG. 4A to obtain defect detection results, and from those results a nominal focus process window is determined as shown in FIG. 4B which eliminates some of the modulated dies as shown in FIG. 4C. In particular, FIG. 4B shows a graph mapping defect polarity in association with changes in the focus parameter values to determine the nominal focus process window. FIG. 4C shows the modulated dies outside of the nominal focus process window (i.e. marked with an X).

Figure 4D:
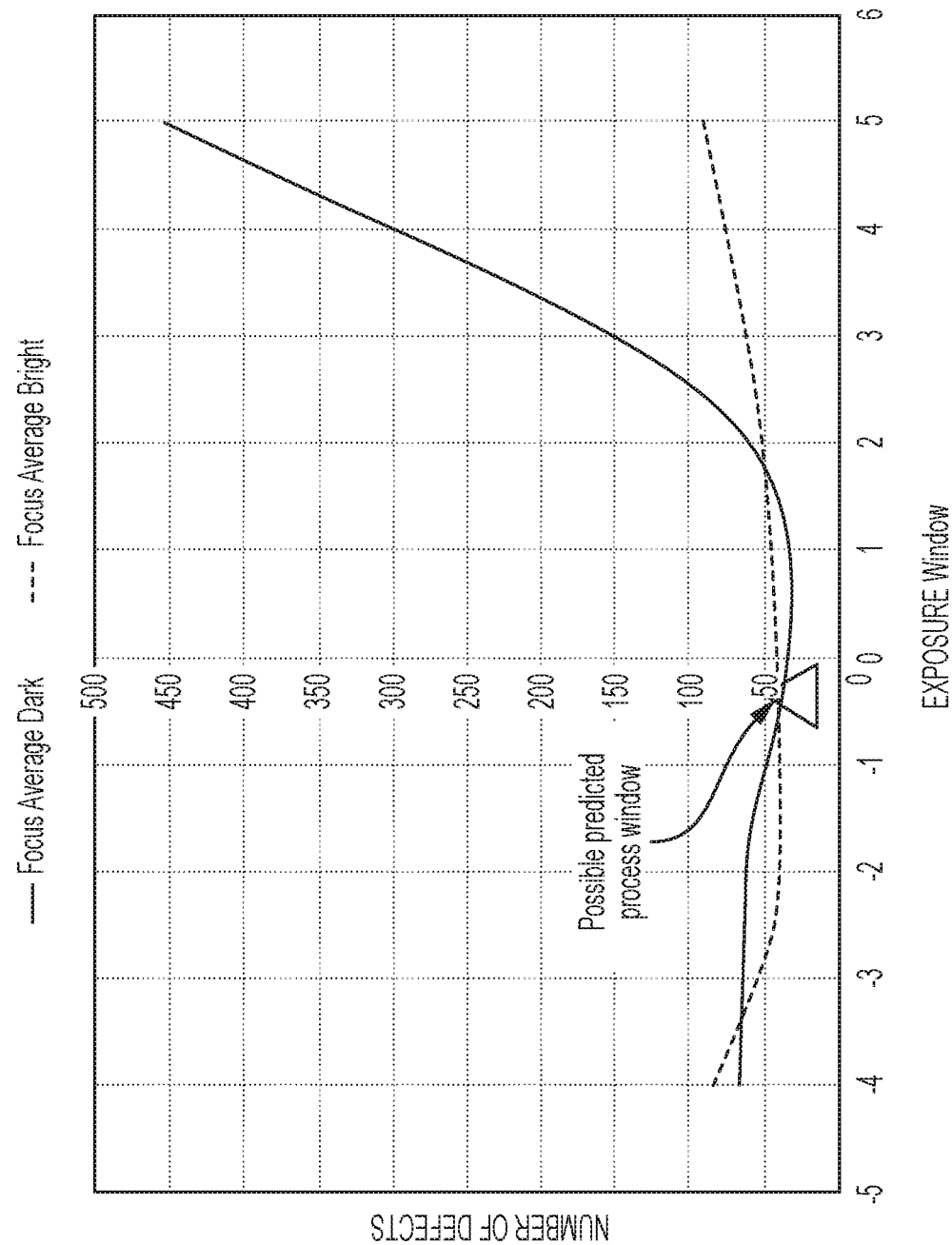
Figure 4E:
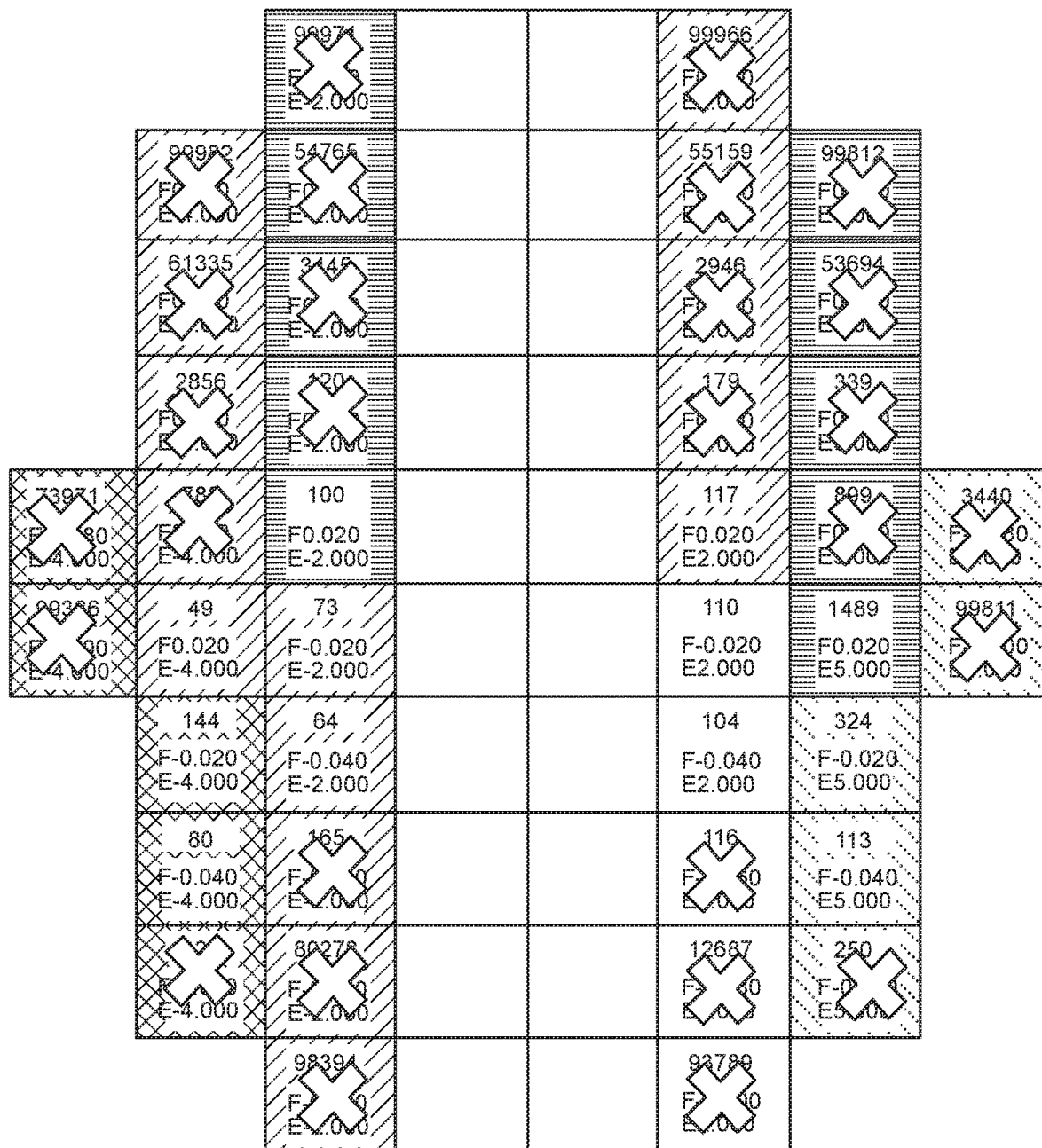

Also from the defect detection results obtained during the first pass described in the method 300 of FIG. 3, a nominal exposure process window is determined as shown in FIG. 4D which eliminates some further modulated dies as shown in FIG. 4E. Specifically, FIG. 4D shows a graph mapping defect polarity in association with changes in the exposure parameter values to determine the nominal exposure process window. FIG. 4E shows the modulated dies outside of both of the nominal focus process window and the nominal exposure process window (i.e. marked with an X). Thus, FIG. 4E shows the remaining modulated dies (i.e. not marked with an X) that are within the predicted process window for the wafer of FIG. 4A. The method 300 of FIG. 3 may then perform the second pass described above using the predicted process window shown in FIG. 4E.

Figure 5:
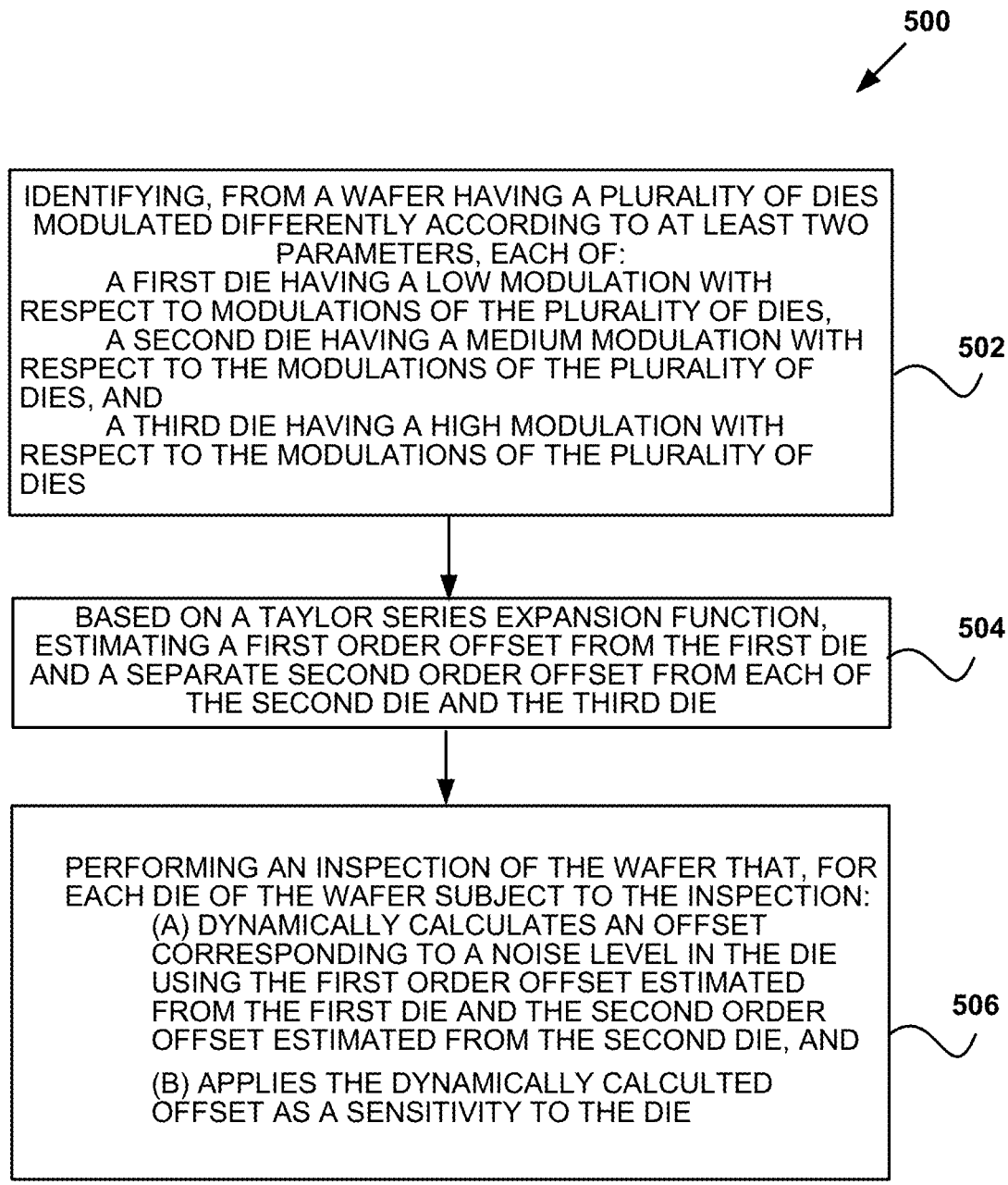
FIG. 5 illustrates a method for tuning sensitivities of a modulated wafer, in accordance with one embodiment.

FIG. 5 illustrates a method 500 for tuning sensitivities of a modulated wafer, in accordance with one embodiment. In one embodiment, the method 500 is performed at runtime (e.g. for defect detection). Thus, the sensitivities for the modulated wafer may be dynamically tuned (i.e. automatically on the fly) by a computer system via this method 500. As described below, the method 500 may dynamically adjust a sensitivity offset and it's derivatives based on noise levels.

As shown in operation 502, the following are identified from a wafer having a plurality of dies modulated differently according to at least two parameters: a first die having a low modulation with respect to modulations of the plurality of dies, a second die having a medium modulation with respect to the modulations of the plurality of dies, and a third die having a high modulation with respect to the modulations of the plurality of dies. The wafer may be the same wafer as described above with respect to FIG. 3, for example.

In one embodiment, a predefined ranking of the dies on the wafer may be used to identify the first die, second die, and third die. The ranking of each die may be a function of the modulation of the die. Thus, the first die may be identified (selected) based on its low ranking (e.g. relative to other rankings), the second die may be identified (selected) based on its mid ranking (e.g. relative to other rankings), and the third die may be selected based on its high ranking (e.g. relative to other rankings). Of course, the particular rankings from which the first die, second die, and third die are identified may be preconfigured. Further, when multiple dies are categorized under each of those particular rankings, then the first die, second die, and third die may be randomly or systematically identified for each of those particular rankings. Of course, however, it should be noted that the first, second and third dies may be identified in any manner to obtain a sampling across the various modulations of the wafer.

Additionally, as shown in operation 504, based on a Taylor series expansion function, a first order offset is estimated from the first die and separate second order offsets are estimated from each of the second die and the third die. The Taylor series expansion function may be a predefined function that is used as a model for a noise-adaptation formula, as described in more detail below. In one embodiment, the first order offset estimated from the first die may be the zero order term in the Taylor series expansion. In another embodiment, the separate second order offset estimated from each of the second die and the third die may be the first order term in the Taylor series expansion applied to the second die and the third die. In one exemplary embodiment, the first order offset includes a parameter (e.g. gray level) offset (e.g. threshold) at which a defect is detected. The first order offset that is estimated from the first die may be non-zero.

Moreover, as shown in operation 506, an inspection of the wafer is performed. The inspection may be an OSTS inspection, in one exemplary embodiment. In the present operation 506, for each die subject to the inspection, the inspection (a) dynamically calculates an offset corresponding to a noise level in the die using the first order offset estimated from the first die and the second order offset estimated from the second die, and (b) applies the dynamically calculated offset as a sensitivity to the die.

In one embodiment, the inspection may be performed on dies of the wafer that are of a primary die type. Thus, the inspection may optionally only be performed on a subset of all dies of the wafer. A customary feature of MDAT is an MDAT file that defines which dies of the wafer are of the primary die type. The MDAT file may also define other dies of the wafer that are of a secondary die type, which may be of interest for an optional secondary inspection (e.g. as described below).

In one embodiment, the offset corresponding to the noise level in the die may be dynamically calculated utilizing the function shown in Table 1, which is set forth for illustrative purposes only.

Table 1 offset=(maximum(first order offset,second order offset_second die×Noise), where Noise is the noise level in the die.

Figure 7:
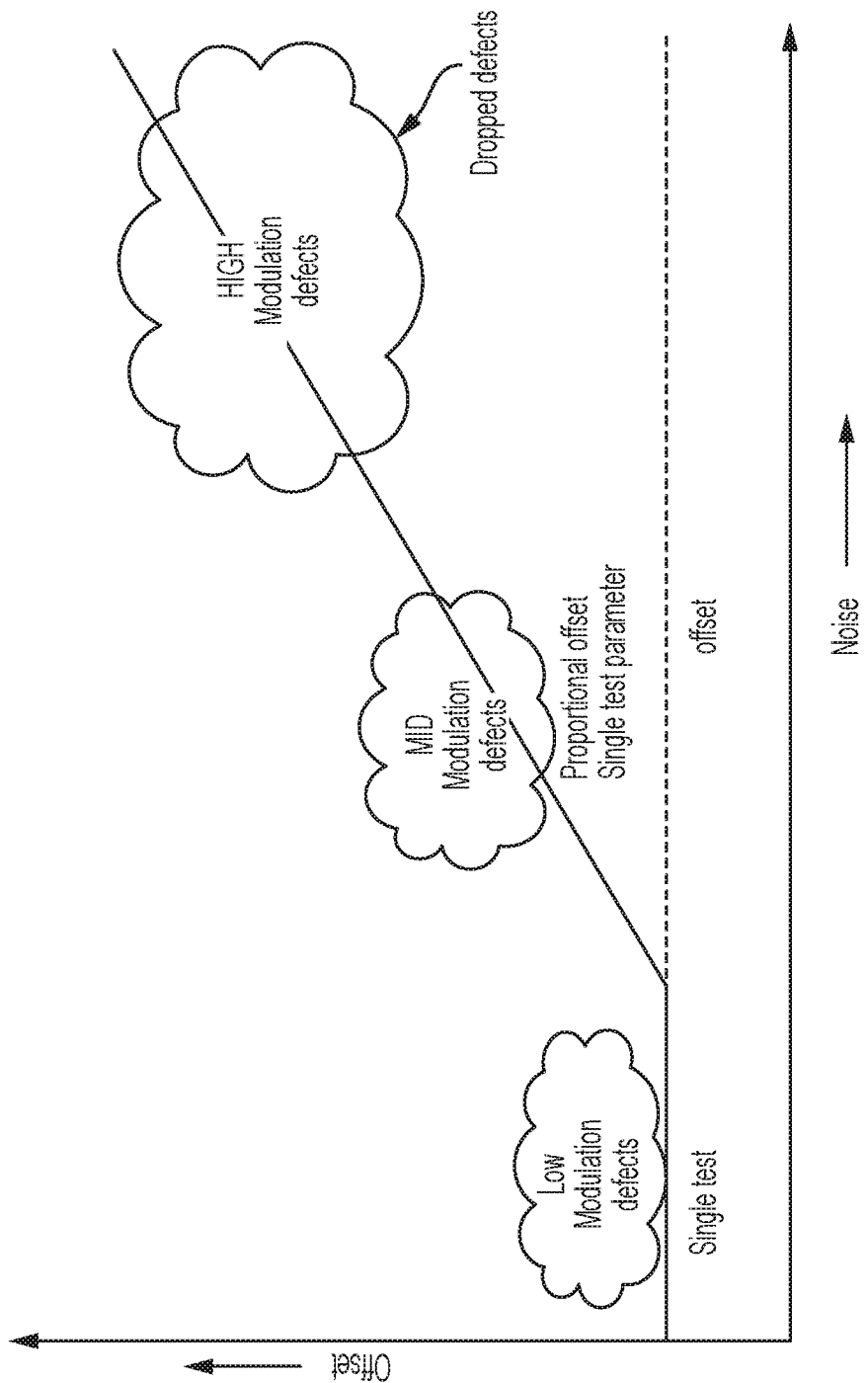
FIG. 7 illustrates a graph showing a linear model by which sensitivities of a modulated wafer are tuned, in accordance with another embodiment.

It should be noted that the sensitivity applied to a particular die may control a number of the defects detected for that particular die, with a lower sensitivity causing less defects to be detected than a higher sensitivity. By dynamically calculating the sensitivity of a die using the function shown in Table 1, the sensitivity may have a direct correlation to the noise detected for that die. In particular, the sensitivity for the dies of the wafer may linearly decrease (i.e. be detuned) as the noise of those dies increases, as shown in FIG. 7. This may allow lower modulated dies to be overtuned and higher modulated dies to be detuned. Furthermore, by dynamically calculating the sensitivity of each die based on the first order offset estimated from the first die and the second order offset estimated from the second die, as described above, the sensitivities may be determined using a single test with a single set of parameters (i.e. the first order offset estimated from the first die and the second order offset estimated from the second die), and therefore the prior art requirement of separate tests for each die may be avoided.

As an option, an additional inspection of the wafer may be performed on dies of the wafer that are of the secondary die type. This additional inspection may be prompted by a user, or may be configured to be prompted automatically, such as when the dynamically calculated offset corresponding to higher modulated dies results in too high of a sensitivity such that too many defects are being detected. Just by way of example, where a maximum number of defects to detect per die and/or per wafer has been set, the additional inspection may be prompted when the higher modulated dies are causing the maximum number of defects to be met.

Figure 6:
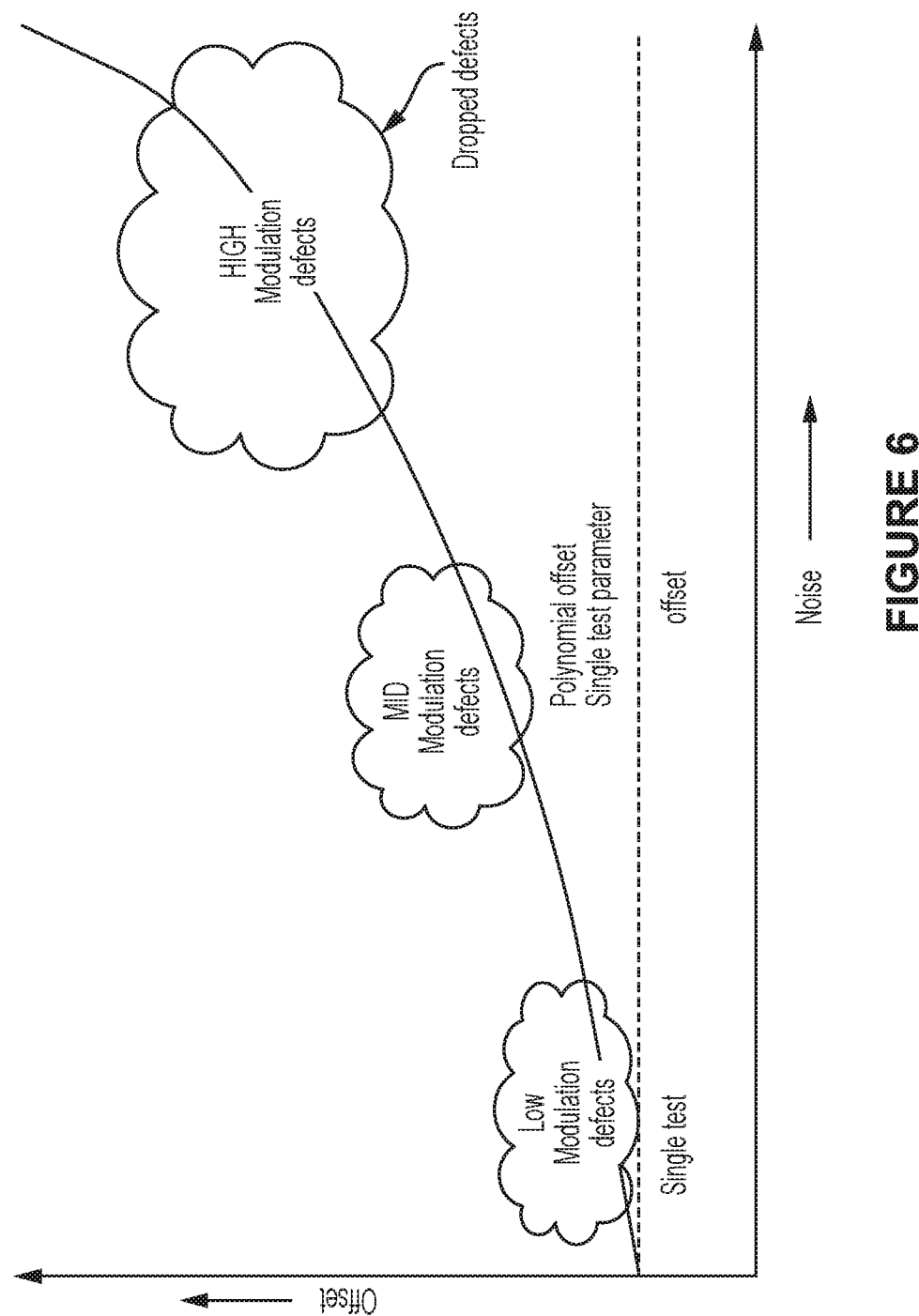
FIG. 6 illustrates a graph showing a polynomial model by which sensitivities of a modulated wafer are tuned, in accordance with another embodiment.

Thus, the secondary die type may include these higher modulated dies. For each further die of the wafer that is subject to the additional inspection, a further offset corresponding to the further die is dynamically calculated using the first order offset estimated from the first die and the second order offset estimated from the third die. This can be accomplished using the function shown in Table 1, but with the second order offset being estimated from the third die instead of the second die. The further offset is then applied as a further sensitivity to the corresponding die. By using the second order offset estimated from the third die, the offset may increase at a higher rate proportional to the noise than when otherwise calculated using the second order offset estimated from the second die. This means that the offset, when calculated using the second order offset estimated from the third die, may allow the higher modulated dies to be inspected without meeting the maximum number of defects. FIG. 6 shows a polynomial model of the offset in relation to noise, including the different trajectory of the offset for the higher modulated dies having the higher noise.

This method 500 avoids the need in the prior art to have multiple tests setup for different modulated dies, and thus perform separate calculations to estimate the inspection sensitivities separately for each die of the wafer. In particular, the single test of the present method 500 may be used to determine the sensitivities of the dies, as described above. Thus, the method 500 makes test recipe management for the wafer more feasible than those required in the prior art. Further, the method 500 can reduce the time of inspection by >2 times the time required by prior art techniques.

Moreover, the method 500 can increase the sensitivity of low modulation dies, while also curtailing excessive detection of defects in high modulation dies through a corresponding reduced sensitivity. This can be enabled through the use of OSTS. This is in contrast to prior art techniques, including specifically ITF, which is prone to de-tuning low modulation dies and over-tuning high modulation dies, thus causing either low sensitivities in low modulation dies or excessive detection of defects in high modulation dies. To this end, the method 500 provides a more efficient and accurate technique for tuning sensitivities for a modulated wafer, with respect to the more time consuming and resource intensive methods of the prior art.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A non-transitory computer readable medium storing a computer program product having code executable by a processor to perform a method comprising:
    identifying, from a wafer having a plurality of dies modulated differently according to at least two parameters, each of:
        a first die having a low modulation with respect to modulations of the plurality of dies,
        a second die having a medium modulation with respect to the modulations of the plurality of dies, and
        a third die having a high modulation with respect to the modulations of the plurality of dies;
    based on a Taylor series expansion function, estimating a first order offset from the first die and separate second order offsets from each of the second die and the third die;
    performing an inspection of the wafer that, for each die of the wafer subject to the inspection:
        (a) dynamically calculates an offset corresponding to a noise level in the die using the first order offset estimated from the first die and the second order offset estimated from the second die, and
        (b) applies the dynamically calculated offset as a sensitivity to the die.

2. The non-transitory computer readable medium of claim 1, wherein the first die, the second die, and the third die are identified using a predefined ranking of each die in the plurality of dies, the ranking of each die being a function of the modulation of the die.

3. The non-transitory computer readable medium of claim 1, wherein the first order offset is non-zero.

4. The non-transitory computer readable medium of claim 1, wherein the offset corresponding to the die is dynamically calculated utilizing the function:
    offset=(maximum(first order offset, second order offset_second die x Noise),
    where Noise is the noise level in the die.

5. The non-transitory computer readable medium of claim 1, wherein the inspection is performed on dies of the wafer that are of a primary die type.

6. The non-transitory computer readable medium of claim 5, further comprising performing an additional inspection of the wafer on dies of the wafer that are of a secondary die type, where the additional inspection, for each further die of the wafer subject to the additional inspection:
    (a) dynamically calculates a further offset corresponding to a noise level in the further die using the first order offset estimated from the first die and the second order offset estimated from the third die, and
    (b) applies the further offset as a further sensitivity to the further die.

7. The non-transitory computer readable medium of claim 6, wherein the additional inspection is prompted by a user.

8. A method performed by a processor, comprising:
    identifying, from a wafer having a plurality of dies modulated differently according to at least two parameters, each of:
        a first die having a low modulation with respect to modulations of the plurality of dies,
        a second die having a medium modulation with respect to the modulations of the plurality of dies, and
        a third die having a high modulation with respect to the modulations of the plurality of dies;
    based on a Taylor series expansion function, estimating a first order offset from the first die and separate second order offsets from each of the second die and the third die;
    performing an inspection of the wafer that, for each die of the wafer subject to the inspection:
        (a) dynamically calculates an offset corresponding to a noise level in the die using the first order offset estimated from the first die and the second order offset estimated from the second die, and
        (b) applies the dynamically calculated offset as a sensitivity to the die.

9. A system, comprising:
    a processor for:
    identifying, from a wafer having a plurality of dies modulated differently according to at least two parameters, each of:
        a first die having a low modulation with respect to modulations of the plurality of dies,
        a second die having a medium modulation with respect to the modulations of the plurality of dies, and
        a third die having a high modulation with respect to the modulations of the plurality of dies;
    based on a Taylor series expansion function, estimating a first order offset from the first die and separate second order offsets from each of the second die and the third die;
    performing an inspection of the wafer that, for each die of the wafer subject to the inspection:
        (a) dynamically calculates an offset corresponding to a noise level in the die using the first order offset estimated from the first die and the second order offset estimated from the second die, and
        (b) applies the dynamically calculated offset as a sensitivity to the die.

* * * * *